United States Patent
Kusakabe

[11] Patent Number: 5,569,942
[45] Date of Patent: Oct. 29, 1996

[54] AVALANCHE PHOTO-DIODE FOR PRODUCING SHARP PULSE SIGNAL

[75] Inventor: Atsuhiko Kusakabe, Tokyo, Japan

[73] Assignee: NEC Corporation, Tokyo, Japan

[21] Appl. No.: 494,556

[22] Filed: Jun. 22, 1995

[30] Foreign Application Priority Data

Jun. 23, 1994 [JP] Japan .................................... 6-163336

[51] Int. Cl.$^6$ ............................................... H01L 31/0328
[52] U.S. Cl. .......................... 257/186; 257/436; 257/438
[58] Field of Search ............................... 257/21, 184, 186, 257/190, 199, 438, 448, 452, 457, 459, 18, 436

[56] References Cited

U.S. PATENT DOCUMENTS 5,179,430  1/1993  Torikai ..................... 257/186
5,179,431  1/1993  Shirai ....................... 257/187
5,406,097  4/1995  Kusakabe ................. 257/186

Primary Examiner—Minhloan Tran
Attorney, Agent, or Firm—Young & Thompson

[57] ABSTRACT

An n$^-$-InGaAs first photo-absorbing layer, an n$^+$-InP multiplication layer, and a p$^+$-type photo-incident region are formed on the first major surface of an n$^+$-InP substrate. An n$^-$-InGaAs second photo-absorbing layer and a p$^+$-InP rear window layer are formed on the second major surface of the substrate. A p-side electrode, an n-side electrode and a transmission carrier absorption electrode are connected to the photo-incident region, the substrate and the rear window layer via contact electrodes, respectively. Since light passing through the first photo-absorbing layer is absorbed in the second photo-absorbing layer, it can be prevented that carriers are generated outside the depletion layer by light reflected by the rear surface. Thus, the trailing response characteristic of the avalanche photodiode (APD) in response to pulse incidental light can be improved.

5 Claims, 4 Drawing Sheets

AVALANCHE PHOTO-DIODE FOR PRODUCING SHARP PULSE SIGNAL

BACKGROUND OF THE INVENTION

1. Field of the Invention

This invention relates to a semiconductor photodetector available for an optical measuring instrument and an optical communication system and, more particularly, to an avalanche photo-diode (hereinafter abbreviated as APD) for producing a sharp pulse signal.

2. Description of the Related Art

The APD per se serves as an amplifier in an optical measuring instrument and an optical communication system, and germanium (Ge) and indium-gallium-arsenide (InGaAs) are available for the APDs at wavelength of 1.3 μm and 1.55 μm.

FIG. 1 illustrates a typical example of the APD formed of germanium, and comprises a substrate 1, a photo-incident region 2 defined in a surface portion of the substrate 1, a guard ring 3 of partially overlapped with the outer periphery of the photo-incident region 2, a transparent passivation film 4 covering the surface of the substrate 1 and electrodes 5, 6 held in contact with the photo-incident region 2 and the rear surface of the substrate 1. The substrate 1 is formed of n-type Ge, and boron is implanted into the surface portion for the photo-incident region 2. The guard ring 3 is formed through a thermal diffusion of zinc, and the transparent passivation film 4 is deposited by using a chemical vapor deposition.

In operation, the p-n junction between the substrate 1 and the photo-incident region 2 is reverse biased so as to extend a depletion layer therefrom, and incident light produces electron-hole pairs in the depletion layer. The carriers thus produced in the presence of the photon are accelerated in the electric field created in the depletion layer, and electric current flows between the electrodes 5 and 6.

Turning to FIG. 2 of the drawings, another prior art APD in the InP-InGaAs-InGaAsP system is illustrated. This prior art APD is fabricated on a substrate of heavily doped n-type InP 11, and comprises a buffer layer 12, a photo-absorbing layer 13, an intermediate layer 14, a multiplication layer 15, a window layer 16 with a photo-incident region 161, a transparent passivation film 17 and electrodes 18 and 19 respectively held in contact with the photo-incident region 161 and the reverse surface of the substrate 11.

The buffer layer 12 to the window layer 16 are epitaxially grown on the substrate 11 through a phase epitaxy, and are formed of n-type InP doped at $1\times10^{15}$ to $2\times10^{16}$ cm$^{-3}$, n-type InGaAs doped at $1\times10^{14}$ to $1\times10^{16}$ cm$^{-3}$, n-type InGaAsP doped at $1\times10^{15}$ to $1\times10^{16}$ cm$^{-3}$, n-type InP doped at $2\times10^{16}$ to $4\times10^{16}$ cm$^{-3}$ and n-type InP doped at $1\times10^{15}$ to $8\times10^{15}$ cm$^{-3}$. In this instance, the buffer layer 12 to the window layer 16 are 1 to 3 μm thick, 1 to 5 μm thick, 0.3 to 1.0 μm thick, 0.8 to 4.0 μm thick and 1 to 2 μm thick, respectively.

The photo-incident region 161 is formed through a diffusion of zinc, and is doped at the $1\times10^{17}$ to $1\times10^{20}$ cm$^{-3}$. A guard ring 20 is partially overlapped with the photo-incident region 161, and is formed through an ion-implantation of beryllium.

In operation, the p-n junction between the photo-incident region 161 and the multiplication layer 15 is reversely biased so that a depletion layer extends from the p-n junction into the photo-absorbing layer 13. The depleted photo-absorbing layer 13 produces electron-hole pairs in the presence of incidental light at the wavelength not greater than 1.67 microns equivalent to the band-gap of InGaAs, and the carriers are accelerated in the electric field ranging between 20 to 100 kV/cm created in the depleted photo-absorbing layer 13. The carriers reach the saturation velocity by the agency of the strong electric field, and current flows between the electrodes 18 and 19.

The intermediate layer 14 featured in the prior art APD shown in FIG. 2 makes the discontinuity between valence band of the photo-absorbing layer 13 of InGaAs and the valence band of the multiplication layer 15 of InP smooth. For this reason, the smooth valence band protects the APD from holes liable to be accumulated at the discontinuity, and allows the APD to produce a sharp leading edge of a photo-detecting signal.

The prior art APDs are available for an optical-time-domain-reflectometer (hereinafter abbreviated as OTDR), and the OTDR detects a reflection due to the Rayleigh scattering for a trouble shooting with an optical fiber. If an optical fiber is broken, the light propagated along the optical fiber is reflected at the broken point, and the reflection returns to the entrance of the optical fiber. The OTDR provided at the entrance converts the reflection into an electric pulse signal, and an analyst determines the break point on the basis of a lapse of time between an emission of light pulse and the detected reflection.

The OTDR is coupled with the optical fiber by means of a connector unit, and the connector unit produces a Fresnel diffraction. After a light pulse of, for example, 100 nanometers is emitted, the Fresnel diffraction is firstly detected by the OTDR, and the Rayleigh reflection, thereafter, arrives thereat. In general, the Fresnel diffraction is much stronger than the Rayleigh reflection, and the OTDR can not discriminate the Rayleigh reflection during the Fresnel diffraction and the pulse decay of the electric pulse signal indicative of the Fresnel diffraction. This means that there is a dead zone in the vicinity of the entrance of the optical fiber, and any broken point in the dead zone can not be found by the OTDR.

One of the approaches is to make the trailing edge of the electric pulse signal sharp, and a decreased pulse decay time shrinks the dead zone.

FIG. 3 shows response characteristics of the prior art APDs, and plots Ge and InGaAs are respectively indicative of the response characteristic of the APD of germanium and the response characteristic of the APD in the InP-InGaAs-InGaAsP system.

The APD of germanium is relatively short in decay time rather compared to that of APD in the InP-InGaAs-InGaAsP system. However, the gentle decay of the APD of germanium starts at a relatively large intensity compared to that of the APD of the InP-InGaAs-InGaAsP system.

SUMMARY OF THE INVENTION

It is therefore an object of the present invention provide an APD which produces an electric pulse signal with a short decay time.

The present inventor analyzed the response characteristics of the prior art APDs, and found that the above described tendencies were derived from structural differences between the APD of germanium and the APD in the InP-InGaAs-InGaAsP system. Namely, the APD in the InP-InGaAs-InGaAsP system absorbed light in the photo-absorbing layer 13 only, and only a negligible amount of time delay took place between the carriers in the vicinity of the intermediate layer 14 and the carriers in the vicinity of the buffer layer 12. Therefore, the sharp trailing edge continued to a relatively small intensity. However, the thin photo-absorbing layer 13 allowed part of the light to be reflected at the electrode 19, and the scattered reflection was absorbed outside the depletion layer. This resulted in the gentle slope from the relatively small intensity.

On the other hand, the prior art APD of germanium absorbed light in the whole substrate 1, and the carrier transit time was widely different depending upon the point where the carriers were produced. However, the reflection at the electrode 6 hardly took place, and the response characteristic was opposite to that of the APD in the InP-InGaAs-InGaAsP system.

The present inventor concluded that reduction of the reflection would achieve a sharp trailing edge.

To accomplish the above object, according to the present invention, there is provided a semiconductor photodetector comprising a semiconductor substrate (101, 201, 301) of a first conductivity type being transparent to incidental light; a first photo-absorbing layer (103, 203, 303) of the first conductivity type formed on a first major surface of the semiconductor substrate; a multiplication layer (105, 205, 305) of the first conductivity type formed on the first photo-absorbing layer and being transparent to the incidental light; a window layer (111, 211, 311) of a second conductivity type formed on the multiplication layer and being transparent to the incidental light; a photo-diode formed on a second major surface of the semiconductor substrate and including at least one second photo-absorbing layer (108, 208, 308); and electrodes (117, 217, 317; 116, 216, 316; 118, 218, 318) electrically connected to the semiconductor substrate, the window layer, and a semiconductor layer formed at a surface of the photo-diode opposite to the semiconductor substrate, respectively.

It is preferable that the thickness of the second photo-absorbing layer be so set that the second photo-absorbing layer can absorb not less than 90% of light entering the second photo-absorbing layer. It is further preferable that the above thickness be so set that the second photo-absorbing layer can absorb not less than 95% of light entering that layer.

In the semiconductor photodetector having the above structure, incidental light is first absorbed in the first photo-absorbing layer. Carriers generated in this layer are multiplied in the multiplication layer, and taken out as an output current of the photodetector.

Part of the incidental light which has not been absorbed in the first photo-absorbing layer passes through the semiconductor substrate and is absorbed in the second photo-absorbing layer. Light that has passed through the second photo-absorbing layer is reflected by the substrate back surface, and again enters the second photo-absorbing layer and is absorbed therein. Therefore, almost 100% of the light that has passed through the first photo-absorbing layer is absorbed in the second light photo-absorbing layer. That is, since the absorptance of the second photo-absorbing layer is set at not less than 90%, not less than 99% of the light that has passed through the first photo-absorbing layer is absorbed in the second photo-absorbing layer in its go and return travel. Where the thickness of the second photo-absorbing layer is so set that the second photo-absorbing layer absorbs not less than 95% of incident light, not less than 99.75% of the light that has passed through the first photo-absorbing layer is absorbed in that layer in its go and return travel. Carriers generated in the second photo-absorbing layer are taken out of the device and discarded.

Thus, according to the invention, since carriers generated in the first photo-absorbing layer travel only the short depletion layer, the trailing level can be reduced. Further, since carriers generated by the light that has passed through the photo-absorbing layer do not affect the true output current, the trailing duration can be shortened.

BRIEF DESCRIPTION OF THE DRAWINGS

The feature and advantages of the avalanche photo-diode according to the present invention will be more clearly understood from the following description taken in conjunction with the accompanying drawings in which.

DESCRIPTION OF THE PREFERRED EMBODIMENTS

First Embodiment

Figure 1:
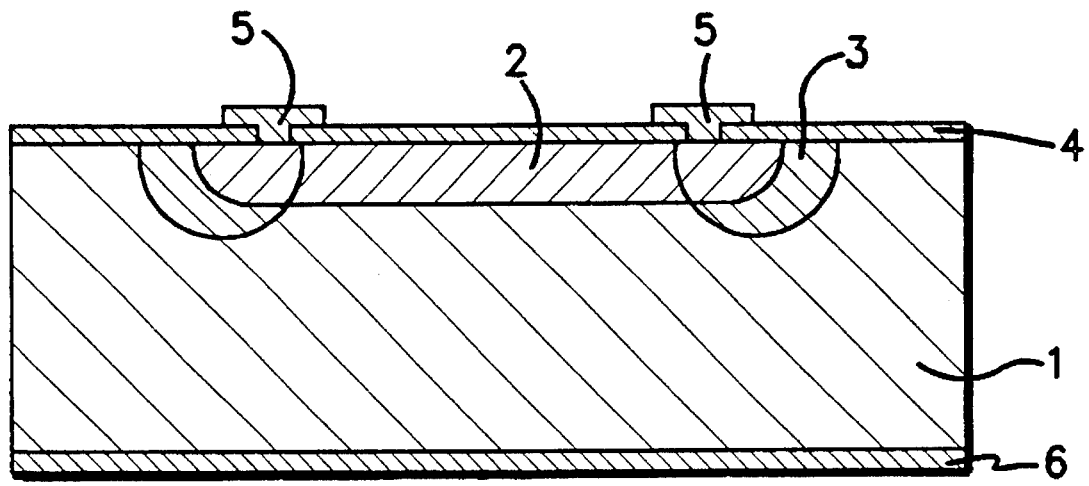
FIG. 1 is a cross sectional view showing the structure of the prior art APD of germanium.
Figure 2:
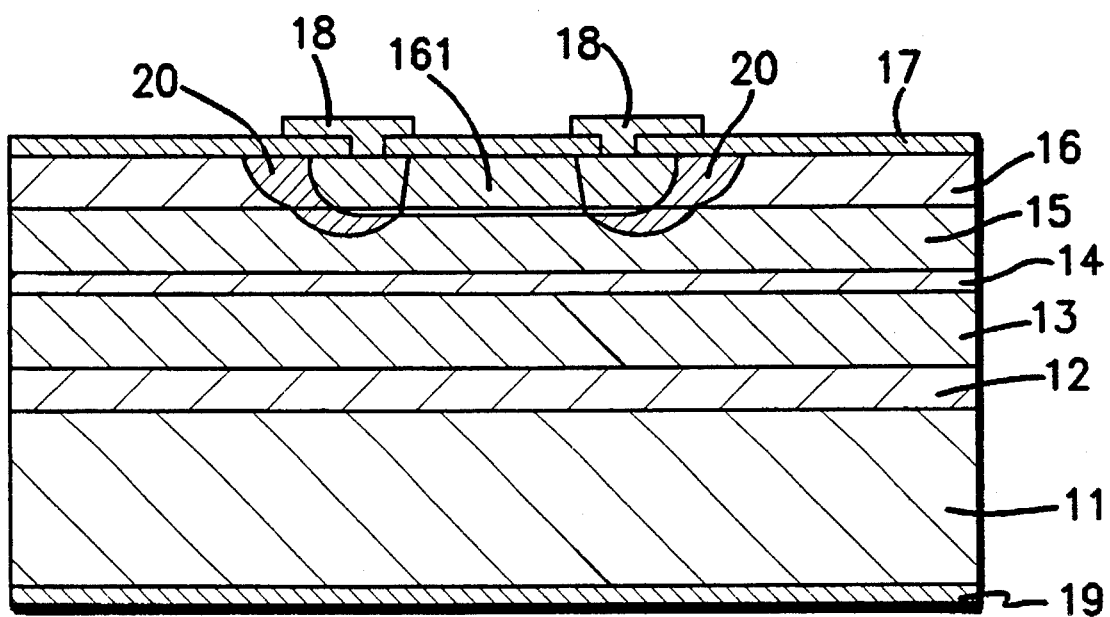
FIG. 2 is a cross sectional view showing the structure of the prior art APD in the InP-InGaAs-InGaAsP system.
Figure 3:
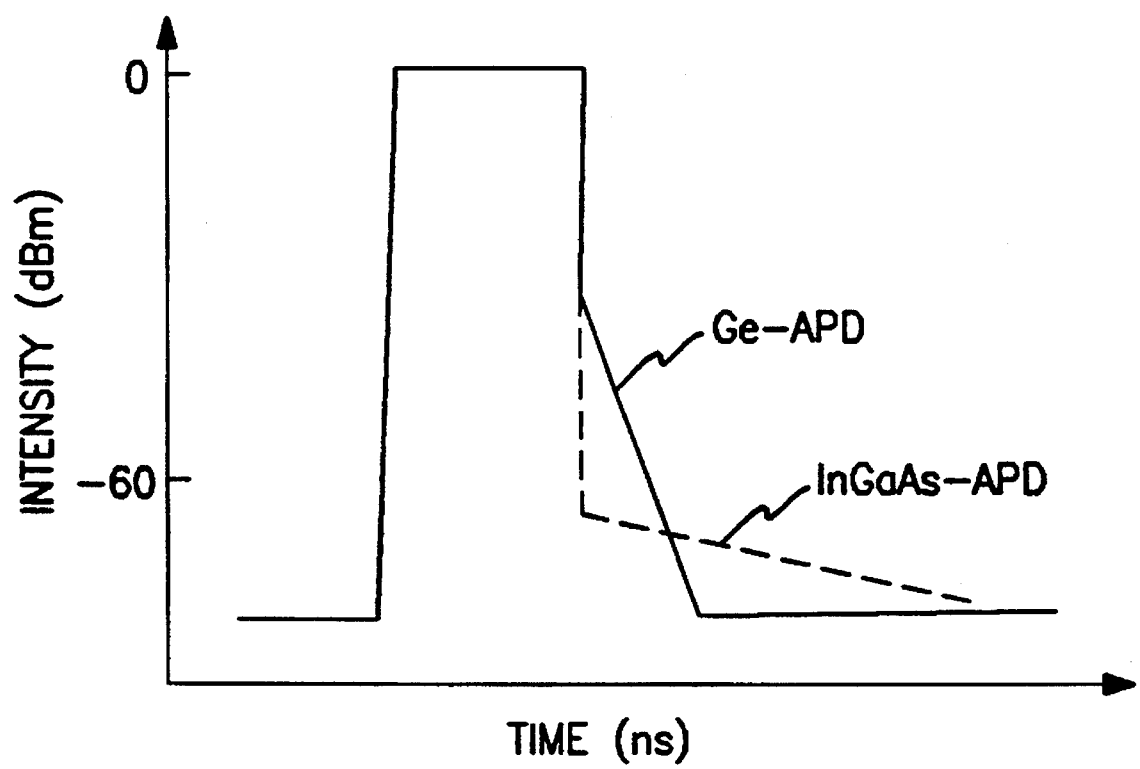
FIG. 3 is a graph showing the response characteristics of the prior art APDs.
Figure 4:
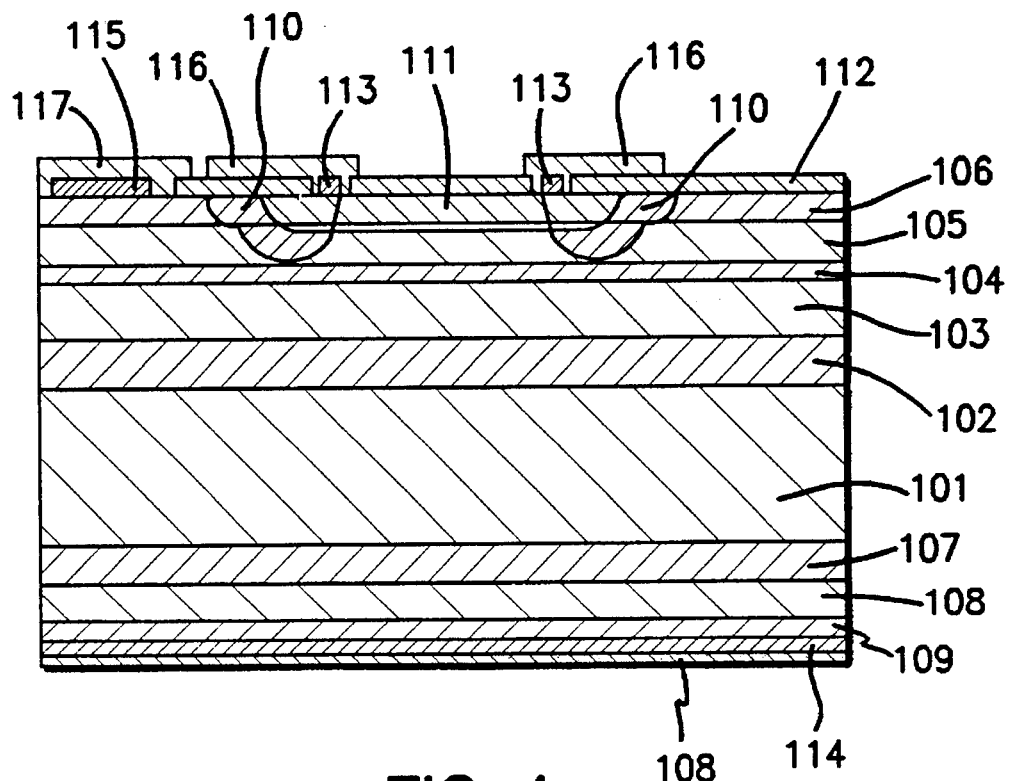
FIG. 4 is a cross sectional view showing the structure of an APD according to the first embodiment of the present invention.

Referring to FIG. 4, the following semiconductor layers are epitaxially grown as first epitaxial layers on an $n^+$-InP substrate 101 by using vapor-phase growth. An n-InP buffer layer 102, whose preferable carrier concentration range and thickness range are $1 \times 10^{15}$ to $2 \times 10^{16}$ $cm^{-3}$ and 1–3 µm, respectively, is formed at $1 \times 10^{15}$ $cm^{-3}$ and 2 µm. A first $n^-$-InGaAs photo-absorbing layer 103, whose preferable carrier concentration range and thickness range are $1 \times 10^{15}$ to $5 \times 10^{15}$ $cm^{-3}$ and 3–4 µm, respectively, are formed at $3 \times 10^{15}$ $cm^{-3}$ and 4 µm. An n-InGaAsP intermediate layer 104, whose preferable carrier concentration range and thickness range are $3 \times 10^{15}$ to $1 \times 10^{16}$ $cm^{-3}$ and 0.03–0.5 µm, respectively, is formed at $1 \times 10^{16}$ $cm^{-3}$ and 0.5 µm. An $n^+$-InP multiplication layer 105, whose preferable carrier concentration range and thickness range are $1 \times 10^{16}$ to $4 \times 10^{16}$ $cm^{-3}$ and 0.5–3 µm, respectively, is formed at $3 \times 10^{16}$ $cm^{-3}$ and 1.4 µm. An $n^-$-InP window layer 106, whose preferable carrier concentration range and thickness range are $2 \times 10^{15}$ to $6 \times 10^{15}$ $cm^{-3}$ and 1–2 µm, respectively, is formed at $5 \times 10^{15}$ $cm^{-3}$ and 1.4 µm.

Subsequently, the following layers are epitaxially grown as second epitaxial layers by using vapor-phase growth on the surface of the $n^+$-InP substrate 101 opposite to the surface on which the first epitaxial layers have been formed. An n-InP buffer layer 107, whose preferable carrier concentration range and thickness range are $1 \times 10^{15}$ to $2 \times 10^{16}$ $cm^{-3}$ and 1–3 µm, respectively, is formed at $1 \times 10^{15}$ $cm^{-3}$ and 2 µm. A second $n^-$-InGaAs photo-absorbing layer 108, whose preferable carrier concentration range and thickness range are $1 \times 10^{15}$ to $2 \times 10^{16}$ $cm^{-3}$ and 2–5 µm, respectively, are formed at $5\times10^{15}$ cm$^{-3}$ and 4 μm. An n$^-$-InP rear window layer (later converted to a p$^+$-InP rear window layer 109), whose preferable carrier concentration range and thickness range are $2\times10^{15}$ to $6\times10^{15}$ cm$^{-3}$ and 1–2 μm, respectively, is formed at $5\times10^{15}$ cm$^{-3}$ and 1.4 μm.

A silicon dioxide film (not shown) is grown, by using CVD, on the surface of the first epitaxial layers of the epitaxial wafer that has been subjected to the two times of epitaxial growth, and then patterned. By using the patterned silicon dioxide film as a mask, a guard ring 110 is formed by introducing, for instance, Be by using ion implantation technique. Then, a diffusion mask window is so opened as to overlap with the guard ring 110, and a p$^+$-type photo-incident region 111 having a carrier concentration of $1\times10^{17}$ to $1\times10^{20}$ cm$^{-3}$ is selectively formed by diffusing Zn, for instance. At the same time, a p$^+$-InP rear window layer 109 having the equivalent carrier concentration is formed on the side of the second epitaxial layers, to thereby formed a photodiode with the n$^-$-InGaAs photo-absorbing layer 108.

After the silicon dioxide film that was used as the mask is removed, an insulating film such as a transparent passivation film 112 is grown on the front surface by an ordinary method. Then, a hole is opened in a portion of the passivation film 112 above the p$^+$-type photo-incident region 111, and a p-side contact electrode 113 is formed in the hole. Further, a p-side contact electrode 114 is formed on the surface of the p$^+$-InP rear window layer 109.

Then, a hole is opened in a portion of the insulating film 112 above a portion of the n$^-$-InP window layer 106 which portion is located outside the guard ring 110 and the p$^+$-type photo-incident region 111 on the side of the first epitaxial layers, and an n-side contact electrode 115 is formed in the hole.

Finally, on the side of the first epitaxial layers, a p-side electrode 116 is formed on the p-side contact electrode 113 and an n-side electrode 117 is formed on the n-side contact electrode 115. On the side of the second epitaxial layers, a transmission carrier absorption electrode 118 is formed on the p-side contact electrode 114.

If a reverse bias voltage applied between the p-side electrode 116 and the n-side electrode 117 of the above-manufactured InGaAs-APD so that the electric field strength becomes 50–200 kV/cm at the boundary between the intermediate layer 104 and the first photo-absorbing layer 103, the first n$^-$-InGaAs photo-absorbing layer 103 is depleted. Further, by applying a reverse bias voltage of 3–6 V between the transmission carrier absorption electrode 118 and the n-side electrode 117, the second n$^-$-InGaAs photo-absorbing layer 108 is depleted.

If pulse light is incident on the APD in the above-described state from the side of the first epitaxial layers, the light passes through the p$^+$-type photo-incident region 111, the multiplication layer 105 and the intermediate layer 104, and enters the first photo-absorbing layer 103, where about 95% of the incidental light is absorbed. Carriers generated by the incidental light absorbed in the layer 103 are multiplied and taken out as an output current from the APD. On the other hand, unabsorbed part of the incidental light passes through the n-InP buffer layer 102, the n$^+$-InP substrate 101 and the n-InP buffer layer 107, and about 100% of that part is absorbed in the depleted second photo-absorbing layer 108. Carriers generated by the light absorbed in the second photo-absorbing layer 108 are caused to flow toward the transmission carrier absorption electrode 118 due to the electric field developing between the transmission carrier absorption electrode 118 and the n-side electrode 117, and taken out of the APD to an external circuit.

Figure 5:
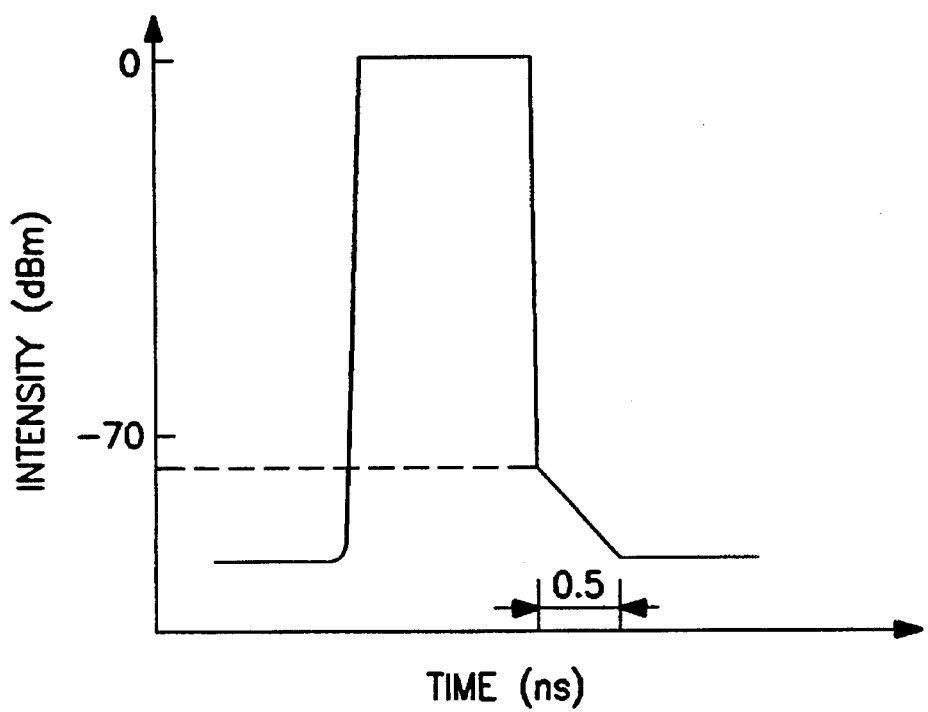
FIG. 5 is a graph showing the response characteristic of the APD according to the first embodiment of the present invention.

FIG. 5 is a graph showing a measurement result of a response characteristics that was obtained when pulse light was incident on the APD of this embodiment. The APD of this embodiment can prevent the phenomenon that part of the incidental light not absorbed in the first n-InGaAs photo-absorbing layer 103 is reflected by the rear surface and then generates carriers that contribute to a slow response component. Therefore, as shown in FIG. 5, the trailing level can be made lower than −70 dBm and the trailing time can be made shorter than 0.5 ns.

Second Embodiment

Figure 6:
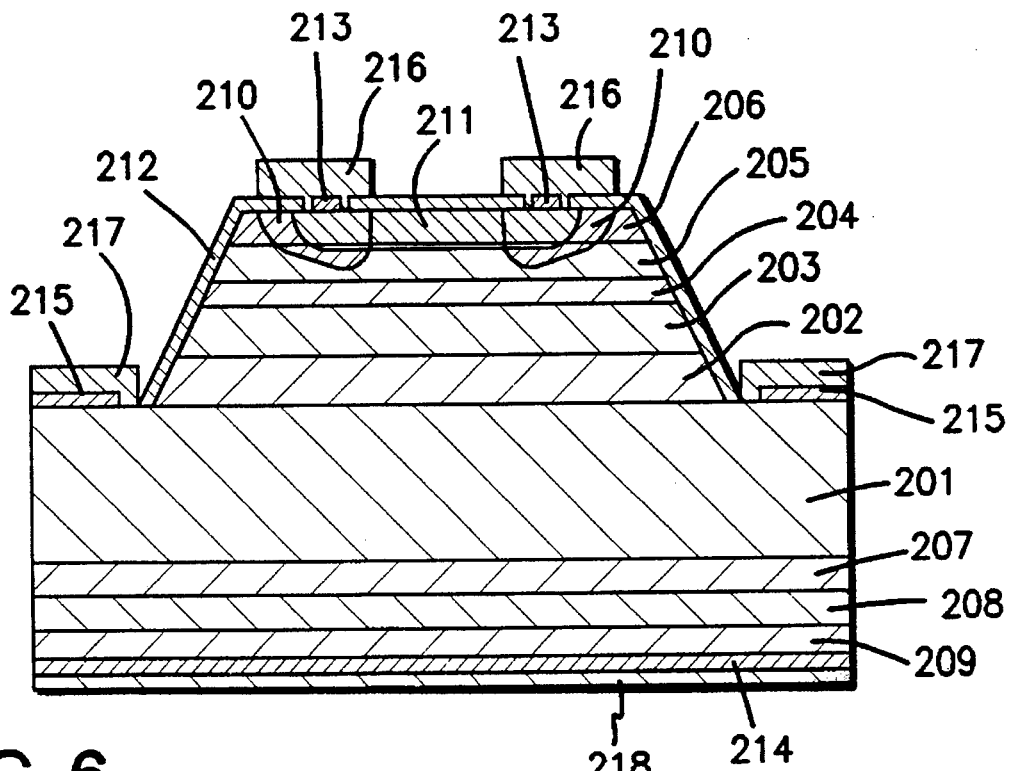
FIG. 6 is a cross sectional view showing the structure of an APD according to the second embodiment of the present invention.

Turning to FIG. 6, another APD according to a second embodiment of the invention is illustrated and which is manufactured in the following manner.

First epitaxial layers are formed on an n$^+$-InP substrate 201 by epitaxially growing, by using vapor-phase growth method, an n-InP buffer layer 202, a first n$^-$-InGaAs photo-absorbing layer 203, an n-InGaAsP intermediate layer 204, an n$^+$-InP multiplication layer 205, and an n$^-$-InP window layer 206 at the same carrier concentrations and thicknesses as in the first embodiment.

Then, second epitaxial layers are formed on the surface of the n$^+$-InP substrate 201 opposite to the surface on which the first epitaxial layers have been formed by epitaxially growing an n-InP buffer layer 207, a second n$^-$-InGaAs photo-absorbing layer 208, and an n$^-$-InP rear window layer (not shown) in the same manner as in the first embodiment.

A silicon dioxide film (not shown) is grown, by CVD, on the surface of the first epitaxial layers of the epitaxial wafer that has been subjected to the two times of epitaxial growth, and then patterned. By using the patterned silicon dioxide film as a mask, a guard ring 210 is formed by introducing, for instance, Be by using ion implantation technique. Then, a diffusion mask window is so opened as to overlap with the guard ring 210, and a p$^+$-type photo-incident region 211 is selectively formed by diffusing Zn, for instance. At the same time, a p$^+$-InP rear window layer 209 having the equivalent carrier concentration is formed on the side of the second epitaxial layers, to thereby formed a photodiode with the n$^-$-InGaAs photo-absorbing layer 208.

Subsequently, a photoresist mask is formed on the guard ring 210 and the p$^+$-type photo-incident region 211 by using photolithography technique, and part of the first epitaxial layers not protected by the photoresist mask is removed by etching until the surface of the n$^+$-InP substrate 201 is exposed.

Then, a transparent insulating film 212 is grown on the surface of the first epitaxial layers by using an ordinary CVD method.

Then, a hole is opened in a portion of the insulating film 212 above the p$^+$-type photo-incident region 211, and a p-side contact electrode 213 is formed in the hole. A p-side contact electrode 214 is formed on the p$^+$-InP rear window layer 209. Further, a hole is opened in the insulating film 212 formed on the n$^+$-InP substrate 201, and an n-side contact electrode 215 is formed in the hole.

Finally, on the side of the first epitaxial layers, a p-side electrode 216 is formed on the p-side contact electrode 213 and an n-side electrode 217 is formed on the n-side contact electrode 215. On the side of the second epitaxial layers, a transmission carrier absorption electrode 218 is formed on the p-side contact electrode 214.

This embodiment can not only provide the n-side contact electrode that contact with the n$^+$-InP substrate with a lower resistance than in the first embodiment, but also increase the breakdown voltage of the APD.

The response characteristic of the APD of this embodiment was measured by applying a bias voltage and inputting pulse light to it. A measurement result was almost the same as that shown in FIG. 5.

Third Embodiment

Figure 7:
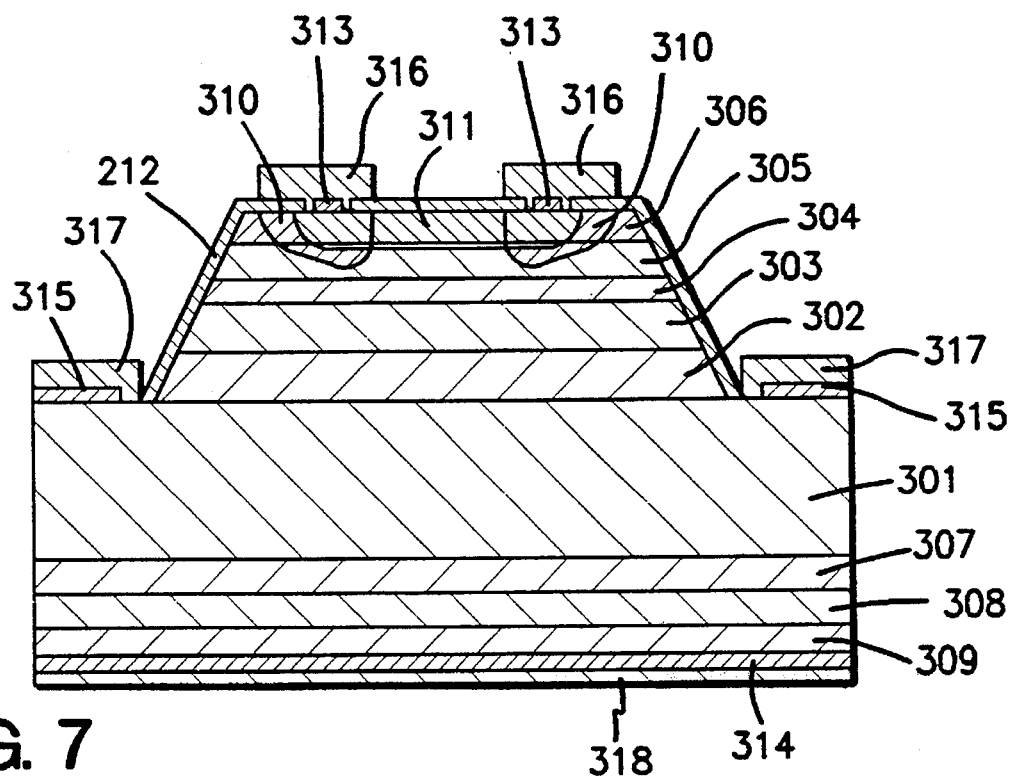
FIG. 7 is a cross sectional view showing the structure of an APD according to the third embodiment of the present invention.

FIG. 7 is a sectional view of an APD according to a third embodiment of the invention, which is manufactured in the following manner.

As first epitaxial layers, an n-InP buffer layer 302, a first n⁻-InGaAs photo-absorbing layer 303, an n-InGaAsP intermediate layer 304, an n⁺-InP multiplication layer 305, and an n⁻-InP window layer 306 are grown on an n⁺-InP substrate 301 in the same manner as in the first embodiment.

Then, second epitaxial layers are formed on the surface of the n⁺-InP substrate 301 opposite to the surface on which the first epitaxial layers have been formed by epitaxially growing the following layers by using vapor-phase growth method: an n-InP buffer layer 307 having a carrier concentration of $1 \times 10^{15}$ cm$^{-3}$ and a thickness of 2 μm, and a second p-InGaAs photo-absorbing layer 308 having a carrier concentration of $5 \times 10^{15}$ cm$^{-3}$ and a thickness of 5 μm, whose preferable carrier concentration range and thickness range are $1 \times 10^{15}$ to $2 \times 10^{16}$ cm$^{-3}$ and 3–6 μm, respectively.

A silicon dioxide film (not shown) is grown, by CVD, on the surface of the first epitaxial layers of the epitaxial wafer that has been subjected to the two times of epitaxial growth, and then patterned. By using the patterned silicon dioxide film as a mask, a guard ring 310 is formed by introducing, for instance, Be by ion implantation technique. Then, a diffusion mask window is so opened as to overlap with the guard ring 310, and a p⁺-type photo-incident region 311 is selectively formed by diffusing Zn, for instance. At the same time, on the side of the second epitaxial layers, a p⁺-InGaAs contact layer 309 is formed on the surface of the second p-InGaAs photo-absorbing layer 308 to thereby formed a photodiode.

Subsequently, after the active region of the APD is etched into a mesa shape, a transparent insulating film 312 is grown on the surface of the first epitaxial layers by using an ordinary method. Then, a p-side contact electrode 313 is formed on the p⁺-type photo-incident region 311, a p-side contact electrode 314 is formed on the p⁺-InGaAs contact layer 309, and an n-side contact electrode 315 is formed on the n⁺-InP substrate 301 in the same manner as in the above embodiment.

Finally, on the side of the first epitaxial layers, a p-side electrode 316 is formed on the p-side contact electrode 313 and an n-side electrode 317 is formed on the n-side contact electrode 315. On the side of the second epitaxial layers, a transmission carrier absorption electrode 318 is formed on the p-side contact electrode 314. Thus, the APD manufacturing of this embodiment is completed.

This embodiment can simplify the manufacturing process because one epitaxial growth step is eliminated.

The response characteristic of the APD of this embodiment was measured by applying a bias voltage and inputting pulse light to it. A measurement result was almost the same as that shown in FIG. 5.

Modifications to the Embodiments

Although the invention has been described above by way of the preferred embodiments, the invention is not limited to those embodiments, but can be modified without departing from the spirit and scope of the invention. For example, although in the above embodiments the epitaxial wafer is obtained by using vapor-phase growth, liquid-phase growth, MOCVD, MBE, ALE and other methods may also be employed for this purpose. Although in the above embodiments are directed to the InGaAs/InP photodetector, the invention can also be applied to photodetectors using other materials.

As described above, according to the semiconductor photodetector of the invention, part of the incident light which has not been absorbed in the first photo-absorbing layer is absorbed in the second photo-absorbing layer that is formed on the second major surface of the semiconductor substrate, and carriers generated in the second photo-absorbing layer can be taken out of the device and discarded separately from the main photodetecting current. Therefore, it can be prevented that part of the incident light which has not been absorbed in the first photo-absorbing layer results in reflection light that re-enters the first photo-absorbing layer, or that carriers generated by such reflection light outside the depletion layer diffuse to the first photo-absorbing layer to contribute to a slow response component. Therefore, the invention cannot only reduce the trailing level of a trailing response characteristic, but also shorten the trailing duration. Further, since a current flowing through the first photo-absorbing layer is not affected by light that passes through the first photo-absorbing layer, the noise level of the APD output can be reduced. With the above advantages, when the photodetector of the invention is used in the OTDR, highly accurate, highly sensitive measurements can be performed as well as the dead zone can be shrinked.

What is claimed is:

1. A semiconductor photodetector comprising:
   a semiconductor substrate of a first conductivity type, said semiconductor substrate being transparent to incident light;
   a first photo-absorbing layer of said first conductivity type formed on a first major surface of said semiconductor substrate;
   a multiplication layer of said first conductivity type formed on said first photo-absorbing layer and being transparent to said incident light;
   a window layer comprising a second conductivity type photo incident region formed on said multiplication layer, said window layer being transparent to said incident light;
   a photodiode formed on a second major surface of said semiconductor substrate opposite to said first major surface and including a second photo-absorbing layer; and
   electrodes electrically connected to said semiconductor substrate, to said window layer, and to a semiconductor layer formed at a surface of said photodiode opposite to said semiconductor substrate, respectively.

2. A semiconductor photodetector according to claim 1, further comprising an intermediate layer between said multiplication layer and said first photo-absorbing layer, for reducing forbidden band discontinuity between said multiplication layer and said first photo-absorbing layer.

3. A semiconductor photodetector according to claim 1, wherein a thickness of said second photo-absorbing layer is set so that said second photo-absorbing layer can absorb not less than 90% of light entering said second photo-absorbing layer.

4. A semiconductor photodetector according to claim 1, wherein said first photo-absorbing layer, said multiplication layer and said window layer are formed on said semiconductor substrate so as to assume a mesa-shaped structure, and an electrode is formed on a portion of said semiconductor substrate surrounding said mesa-shaped structure so as to be in contact with said semiconductor substrate.

5. A semiconductor photodetector according to claim 1, wherein said semiconductor substrate, said multiplication layer and said window layer are made of InP, and said first and second photo-absorbing layers are made of InGaAs.

\* \* \* \* \*